Figure 1:
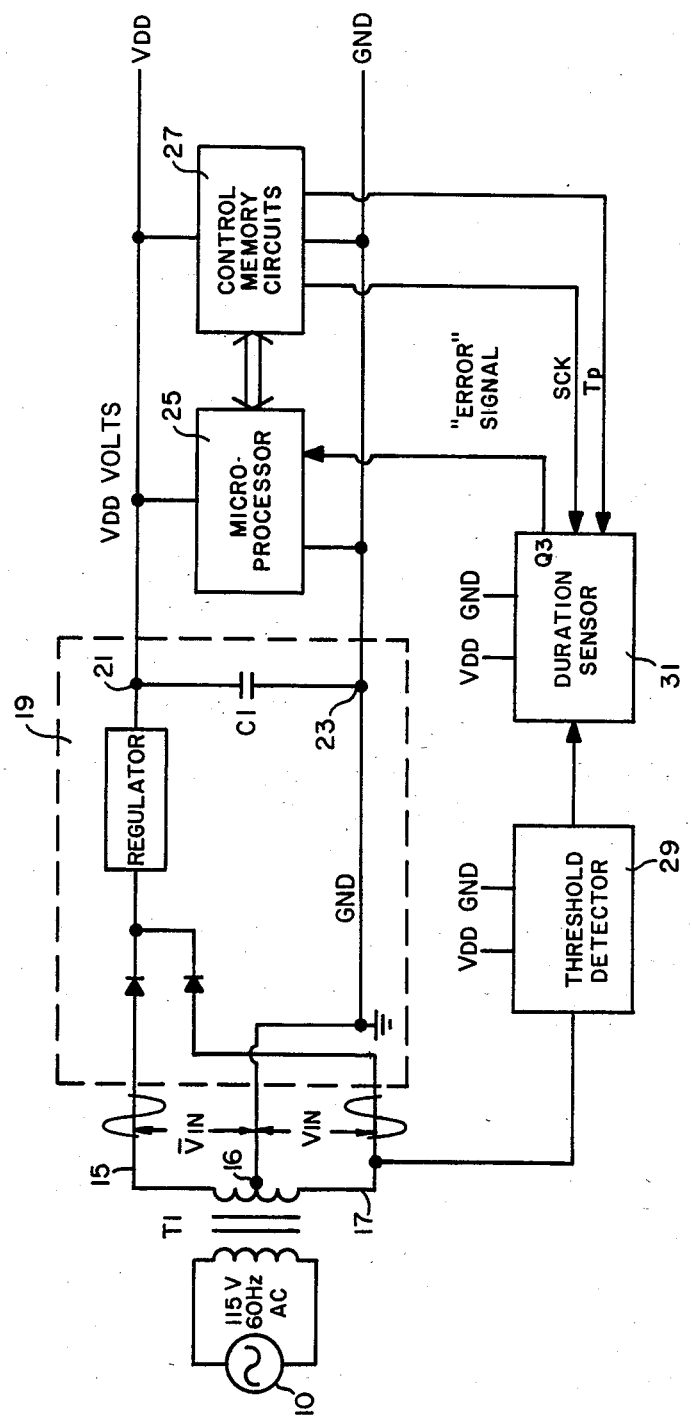

United States Patent [19]

Cohen et al.

[11] Patent Number: 4,594,517
[45] Date of Patent: Jun. 10, 1986

[54] POWER DOWN SENSOR

[75] Inventors: William R. Cohen, North Plainfield Borough; James E. Gillberg, Raritan Township, Hunterdon County, both of N.J.

[73] Assignee: RCA Corporation, Princeton, N.J.

[21] Appl. No.: 605,241

[22] Filed: Apr. 30, 1984

[51] Int. Cl.[4] ............................................ H03K 17/22
[52] U.S. Cl. .......................... 307/296 R; 307/200 A; 307/354; 361/92
[58] Field of Search .................. 307/351, 354, 200 A, 307/464, 448, 296 R; 361/92

[56] References Cited

U.S. PATENT DOCUMENTS 4,165,491  8/1979  Geffon ................................ 307/354
4,394,702  7/1983  Boothe ............................ 307/200 A
4,420,789 12/1983  Breen ............................. 307/200 A
4,490,632 12/1984  Everett et al. ..................... 307/448

Primary Examiner—John S. Heyman
Attorney, Agent, or Firm—Joseph S. Tripoli; George E. Haas; Henry I. Schanzer

[57] ABSTRACT

The loss of an AC supply voltage is detected by sensing the amplitude of the AC voltage relative to the reference potential about which it periodically goes positive and negative. Whenever the amplitude of the signal is below a given threshold, a sub-threshold signal is produced and its duration is sensed. If its duration is shorter than a predetermined sampling period, the sub-threshold signal is treated as a normally occurring signal and is filtered out of the system. If its duration exceeds the predetermined sampling period, it indicates that the AC voltage has remained "low" for too long a period of time, and an error signal is generated.

10 Claims, 3 Drawing Figures

POWER DOWN SENSOR

This invention relates to circuitry for detecting a decrease or interruption in the alternating current (AC) voltage supplied to a system.

In many systems, an AC voltage is rectified and filtered to produce a direct current (DC) voltage which is then distributed to components of the systems to function as the operating voltage of the components. The loss of the DC voltage or its decrease below some predetermined level may cause the system components and the system to operate in an undesirable and/or disastrous manner. For example, data read out of a memory whose operating voltage is below some specified level is not reliable. Similarly, a microprocessor whose operating voltage falls below a specified level will not process information correctly, resulting in significant errors and faults. It is therefore necessary to sense the impending loss of the operating voltage to the system components in order to take remedial action prior to the system becoming partly or wholly disabled.

Known methods to detect the impending loss of the operating voltage supplied to a system suffer from some disadvantage. For example, U.S. Pat. No. 4,099,068 to Kobayashi et al. entitled POWER SUPPLY INTERRUPTION DETECTING CIRCUIT, teaches that the impending loss of the DC voltage supplied by a main DC power supply may be detected by using an auxiliary DC supply whose AC input is derived from the same AC source as the main DC supply. The main DC supply is designed to have a much larger time constant than the auxiliary supply whereby a drop in the AC source will affect the output of the auxiliary DC supply long before the main DC supply is affected. Circuitry is then used to sense a decrease in the voltage level of the auxiliary DC supply in order to place the system in a desired state. This scheme though useful has the obvious disadvantage that two rectifying circuits are needed. Also, failure is sensed after rectification which may be a significant time period after the AC voltage has been lost.

Another scheme, depicted in FIG. 1 of Kobayashi et al., shows a relay (D) connected across the primary winding of a transformer to sense the loss of the AC voltage. The relay, presumably an AC relay since a DC relay would require rectification, responds to a drop in the amplitude of the AC voltage. However, relays take up much space and, insofar as understood, AC relays have an uncertain response and their operation is questionable. Also, sensing is dependent on the full, or peak, amplitude of the AC voltage. This is undesirable because the amplitude of the AC supply voltage normally varies considerably as a function of time. Therefore, this solution is also not satisfactory.

The problem of sensing a loss in the AC voltage supply is resolved, in systems embodying the invention, by sensing the amplitude of the AC voltage relative to the reference level about which the AC voltage alternately goes positive and negative. This enables sensing of the presence or absence of the AC voltage without having to measure or sense large amplitude signals. In a system embodying the invention means are provided for sensing the AC voltage and generating a sub-threshold signal whenever the AC voltage is less negative than a first threshold voltage ($V_{T1}$ volts) below a reference potential (e.g. zero volts) and less positive than a second threshold voltage ($V_{T2}$ volts) above the reference potential. Thus, in systems embodying the invention sensing of the AC voltage is accomplished relative to the reference voltage about which the AC voltage alternates periodically. A sub-threshold signal of known duration is normally produced each half cycle when the AC voltage makes a transition between its positive and negative ranges. The duration of the sub-threshold signal is sensed. If the duration is shorter than a predetermined sampling period, the sub-threshold signal is treated as a normally occurring (e.g. zero cross-over) signal and is filtered out of the system. However, if the duration of the sub-threshold signal exceeds a predetermined sampling period, it indicates that the AC voltage is within the sub-threshold band (i.e. between $V_{T1}$ and $V_{T2}$ volts) for too long a period of time. It is then treated as an error signal and an alarm is generated.

Figure 2:
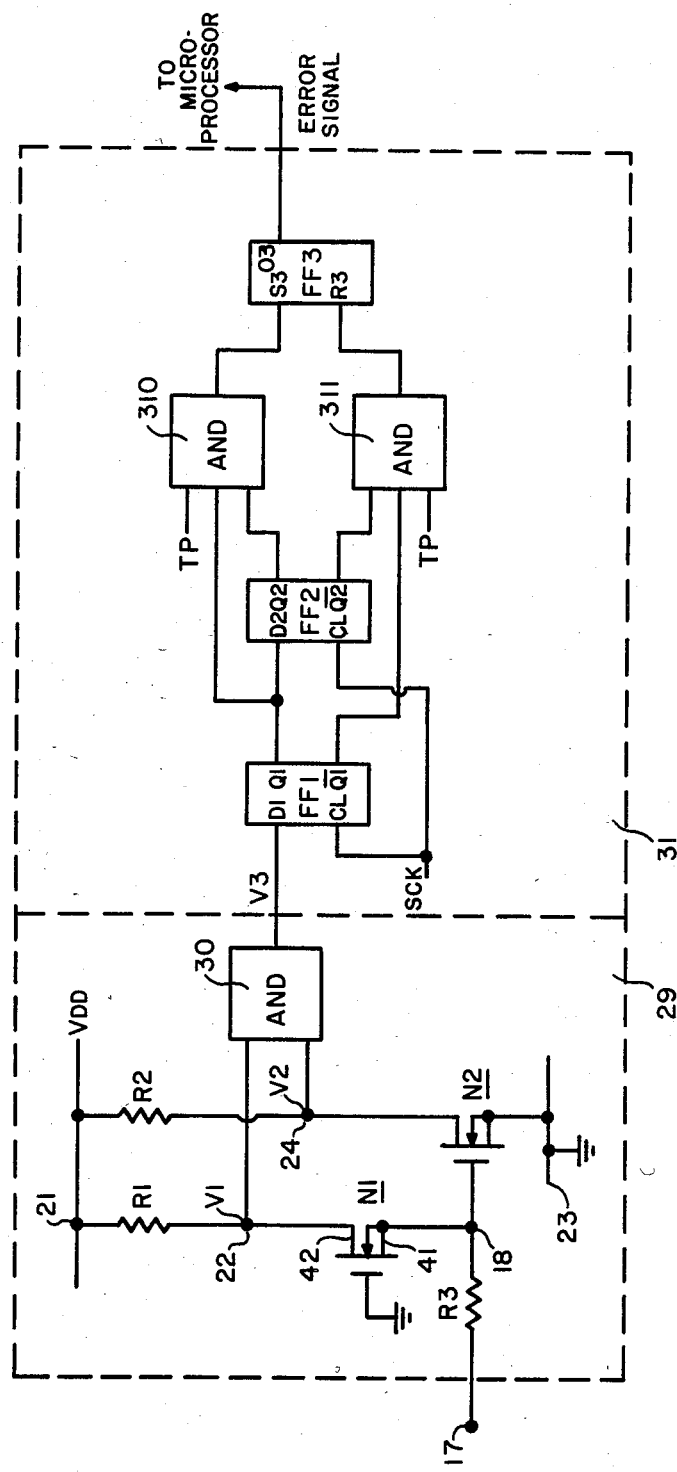
Figure 3:
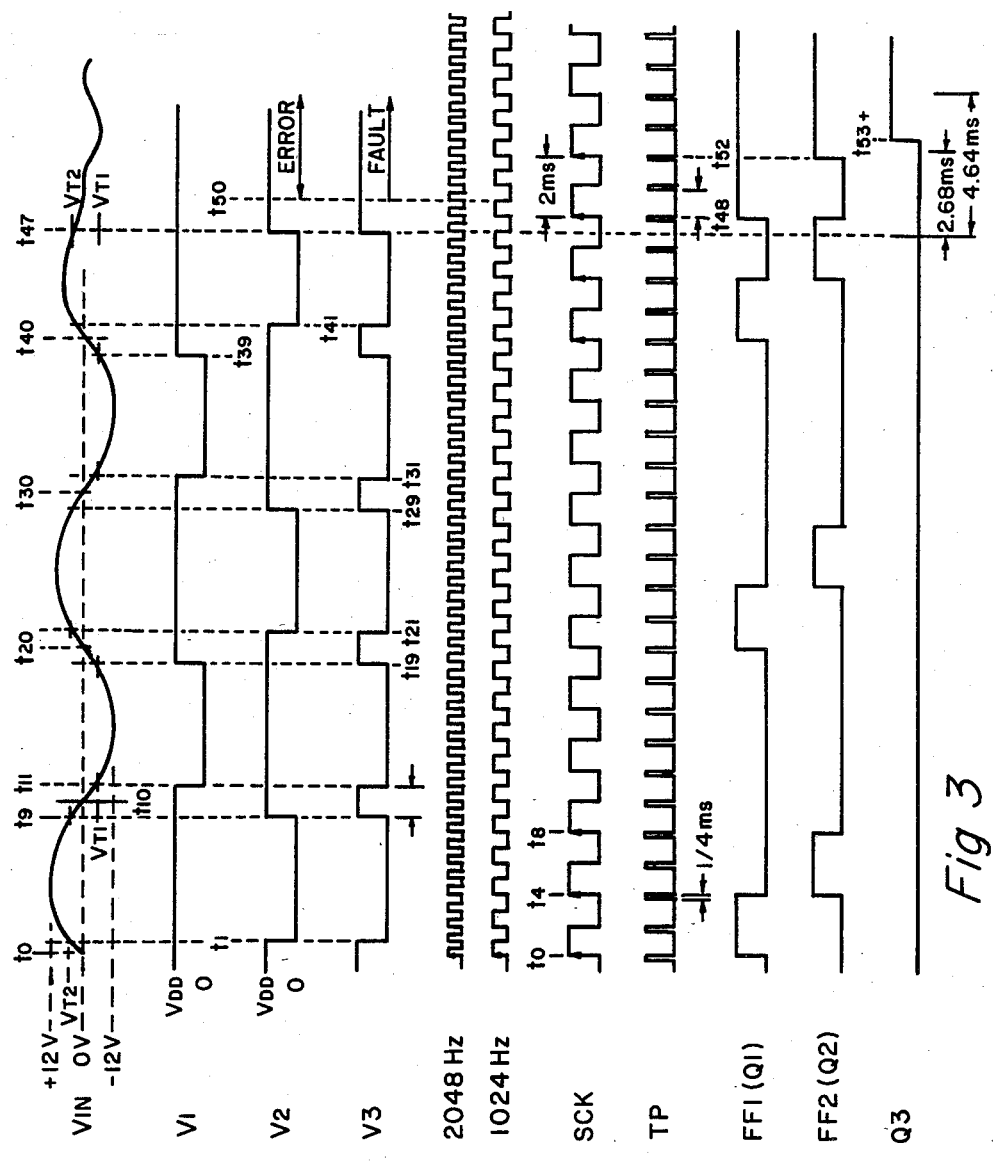

In the accompanying diagram, like reference characters denote like components; and FIG. 1 is a block diagram of a system embodying the invention;

FIG. 2 is a schematic diagram of circuitry useful in the system embodying the invention; and FIG. 3 is a diagram of waveforms associated with FIGS. 1 and 2.

The circuit of FIG. 1 includes a 115 v, 60 Hz AC voltage source 10 which is applied across the primary windings of a step-down transformer T1. The secondary winding of T1, connected between terminals 15 and 17, is center-tapped and grounded at terminal 16 whereby the signal ($V_{IN}$) produced between secondary terminals 15 and 16 is equal in amplitude, but complementary in phase, to the signal produced between secondary terminals 16 and 17. $V_{IN}$, as shown in FIG. 3, is assumed to have a peak-to-peak value of 24 volts (i.e. ±12 volts) centered about zero volts. The output of the transformer secondary is applied to a full-wave rectifier/regulator and filter 19 to produce a DC voltage of $V_{DD}$ volts amplitude between terminals 21 and 23. In the discussion to follow, it is assumed that terminal, or line, 21 is at +5 volts relative to terminal 23 which is connected to terminal 16 and which is at system ground or zero volts. A relatively large capacitor C1 is connected between terminals 21 and 23 to filter out some of the ripple, noise and transients on the DC power supply lines. C1 and other distributed capacitance (not shown) connected between terminals 21 and 23 store sufficient charge to ensure that the DC voltage is normally maintained for an extended period of time (e.g. 50 milliseconds or more) after an interruption in the AC voltage.

The DC voltage ($V_{DD}$ volts) on line 21 is distributed to a microprocessor 25, a control and memory circuit 27, a threshold detector 29, a duration sensor 31 and to other components of the system (not shown). Ground potential on line 23 is also distributed to the system components. The data input-output (I/O) terminals of the microprocessor are coupled to control and memory circuit 27 as well as to other circuits (not shown). Microprocessor 25 functions as the controller for many of the circuits of the system. The microprocessor is alerted to the impending loss of the DC voltage by the application of an "error" signal from sensor 31. The microprocessor, in response to this signal, can then place itself, as well as the circuitry it controls, in a predetermined mode. For example, in response to an error signal, the microprocessor powers down the system in an orderly manner. It also prevents further processing of data obtained from memory since the data is no longer reliable. Furthermore, if the microprocessor or the memory include non-volatile memory or battery backup, it may store the necessary information to recall the occurrence of the power failure, and to preset the system to enable it to start up in a predetermined manner when power is again applied.

The AC voltage, referred to herein as $V_{IN}$, at the secondary of T1, is applied to threshold detector 29 which senses when the amplitude (whether positive or negative) of $V_{IN}$ is below a certain "threshold" level. As detailed below, when the amplitude of $V_{IN}$ is less negative than a first threshold level (i.e, $-V_{T1}$ volts) below ground or is less positive than a second threshold level (i.e., $+V_{T2}$ volts) above ground, a "sub-threshold" signal is produced.

The "sub-threshold" signal is applied to duration sensor 31 which produces an "error" signal when the "sub-threshold" signal indicative of the low amplitude $V_{IN}$ level is present for more than a preselected period. The "error" signal is then applied to microprocessor 25. Since the "error" signal typically occurs well before any change in the voltage level of $V_{DD}$, the microprocessor can reliably process the signal and program itself and other circuits of the system to a desired state prior to any significant decrease of the DC voltage.

The detailed operation of the system of FIG. 1 is best explained and understood with reference to FIG. 2 which depicts the schematic of threshold detector 29 and a block diagram of duration sensor 31.

Threshold detector 29 includes a current limiting resistor R3 connected between terminal 17, which defines one end of the secondary of transformer T1, and an internal node 18. The source electrode (41) and the substrate of an insulated-gate field-effect transistor (IGFET) N1 and the gate electrode of an IGFET N2 are connected to node 18. The gate electrode of N1 and the source electrode and the substrate of N2 are returned to ground terminal 23. The drain electrode (42) of N1 is connected to an output node 22 at which is produced an output voltage V1 and the drain electrode of N2 is connected to an output node 24 at which is produced an output voltage V2. Load resistors R1 and R2, which may be assumed to be relatively large impedances, are connected between the $V_{DD}$ supply line 21 and nodes 22 and 24, respectively.

Transistor N1 is shown with its source and substrate connected to node 18. The threshold detector can be fabricated on the same integrated circuit. N1 is formed in its own P-well; that is, a P-well which is isolated, and different, from the P-well in which N2 is formed, because the source, substrate and drain of N1 can be driven negative with respect to ground, as discussed below.

The outputs V1 and V2 are applied to an AND gate 30 to produce an output V3. As discussed below, the output V3 is "high" (i.e. equal, or close, to $V_{DD}$ volts) when V1 and V2 are both high and V3 is "low" (i.e. at, or close to, zero volts) when either one or both of V1 and V2 are low.

The detailed operation of detector circuit 29 is best explained with reference to the waveform diagram of FIG. 3. Assume first that the AC signal has been present for several cycles such that $V_{DD}$ is at a desired level (e.g. +5 volts). Assume also, as shown in FIG. 3, that, normally, $V_{IN}$ varies about zero volts and changes direction at regular intervals, i.e., it goes positive for one-half cycle and goes negative for the next half cycle. Still further, assume that the DC voltage (i.e. $V_{DD}$) remains essentially unchanged when $V_{IN}$ goes to zero for less than 50 milliseconds. Finally, note that an insulated-gate field-effect transistor (IGFET) is turned-on and can conduct when the potential ($V_{GS}$) applied between its gate and source electrodes is in a direction to turn-it-on and exceeds its threshold voltage ($V_T$). The $V_T$ of N1 is $V_{T1}$ and the $V_T$ of N2 is $V_{T2}$. For ease of the description to follow, it is assumed that $V_{T1}$ is equal to $V_{T2}$.

The operation of detector 29 will first be discussed for the condition when the AC signal goes positive with respect to ground and then for the condition when the AC signal goes negative with respect to ground.

When $V_{IN}$ is at zero volts, N1 and N2 are turned-off since their gate-to-source potentials ($V_{GS}$) are zero. As $V_{IN}$ goes positive with respect to ground, electrode 41 of N1 is driven positive and electrode 42 remains at $V_{DD}$ volts. Since the gate electrode of N1 is grounded the gate-to-source potential of N1 is then in a direction to inhibit conduction in N1 and N1 remains turned-off. Thus for all positive values of $V_{IN}$ relative to ground, N1 is turned-off and V1 is at $V_{DD}$ volts. However, as $V_{IN}$ goes positive relative to ground and reaches the threshold voltage ($V_{T2}$) of N2, N2 is turned-on and current then flows from node 21 via R2 and the drain-to-source conduction path of N2 to ground. Since R2 is a relatively large impedance, V2 goes low (i.e. at, or close to, ground) as soon as $V_{IN}$ reaches and exceeds $V_{T2}$ volts. Thus, when $V_{IN}$ is between 0 and $+V_{T2}$ volts, N1 and N2 are turned-off and V1 and V2 are at $V_{DD}$ volts. When $V_{IN}$ is more positive than $+V_{T2}$ volts N2 is turned-on and V2 goes to zero volts as shown for times $t_1-t_9$ and $t_{21}-t_{29}$ in FIG. 3. For all values of $V_{IN}$ more negative than $+V_{T2}$ volts, N2 is turned-off and V2 remains at $V_{DD}$ volts as shown, in FIG. 3 for times $t_9-t_{21}$ and $t_{29}-t_{41}$.

As noted above, for $V_{IN}$ equal to zero volts, N1 is off and V1 is at $V_{DD}$ volts. In fact, N1 remains turned-off until $V_{IN}$ reaches $-V_{T1}$ volts. However, as $V_{IN}$ goes negative with respect to ground, node 18 is likewise driven negative with respect to ground. When $V_{IN}$ reaches and exceeds $-V_{T1}$ volts, source electrode 41 of N1 is at least $V_{T1}$ volts below its grounded gate. The $V_{GS}$ of N1 now exceeds its threshold voltage (i.e. $V_{T1}$) and N1 is turned-on. Current then flows from node 21 via R1 and via the drain-to-source path of N1 into node 18. Assuming R1, like R2, to have a relatively large impedance, the potential V1 drops relatively sharply from $+V_{DD}$ volts to zero volts as shown, for example, in waveform V1 of FIG. 3 at times $t_{11}$ and $t_{31}$. Thus, N1 is turned-on and conducts and causes V1 to go "low" whenever $V_{IN}$ is more negative than $-V_{T1}$ volts. However for all values of $V_{IN}$ more positive than $-V_{T1}$ volts N1 is turned off. Although V1 is shown to remain at ground for the full negative half cycle of $V_{IN}$, V1 can, in fact, go more negative than zero volts since it follows the voltage at node 18. However, V1 going negative with respect to ground does not affect the operation of the circuit and it is therefore assumed to remain at ground.

In brief, N2 is turned-on and V2 is low when $V_{IN}$ is more positive than $V_{T2}$ volts and N1 is turned-on and V1 is low when $V_{IN}$ is more negative than $-V_{T1}$ volts; where $V_{T2}$ and $V_{T1}$ are the threshold voltages of N2 and N1, respectively. Hence, N1 and N2 are both off and V1 and V2 are both high when $V_{IN}$ is in the range between $+V_{T2}$ volts and $-V_{T1}$ volts. Thus whenever $V_{IN}$ passes from $+V_{T2}$ volts to $-V_{T1}$ volts or from $-V_{T1}$ volts to $+V_{T2}$ volts, V1 and V2 are driven high simultaneously, causing V3 to go high for the period of time V1 and V2 are both high. To pass between $V_{T1}$ and $V_{T2}$, $V_{IN}$ must cross the zero voltage reference level. Thus detector 29 functions as a band detector producing a positive going pulse at V3 during the time that the amplitude of $V_{IN}$ is in the range between $+V_{T2}$ and $-V_{T1}$ volts or $\pm V_T$ volts, where $V_T = V_{T2} = V_{T1}$.

Thus V1 is "high" for all values of $V_{IN}$ more positive than a first threshold (i.e. $-V_{T1}$) and V2 is "high" for all values of $V_{IN}$ more negative than a second threshold (i.e. $+V_{T2}$) Applying V1 and V2 to AND gate 30 produces output V3. As shown in FIG. 3, V3 goes high each half cycle when V1 and V2 are both high, which occurs each time $V_{IN}$ is within the band lying between $+V_{T2}$ volts and $-V_{T1}$ volts as shown, for example, in FIG. 3 at times $t_9-t_{11}$, $t_{19}-t_{21}$, $t_{29}-t_{31}$, . . . etc.

A significant feature of the invention is that the presence or absence of the AC voltage is sensed relative to the reference voltage. The full amplitude (e.g. $\pm 12$ volts) of the AC voltage which may vary considerably is not relied upon. Rather, it is the relatively small and easily measurable transitions of the AC supply voltage about the zero or crossover point which are sensed. If the AC voltage is present and, within its normal range, then $V_{IN}$ must perforce regularly traverse the band or range bounded by the threshold levels of $V_{T2}$ and $-V_{T1}$.

During normal operation, the period of each cycle of a 60 Hz voltage is 16.66 milliseconds and the AC signal crosses the reference voltage line (zero volts) every 8.33 milliseconds. Each time $V_{IN}$ passes ground potential (in either the positive or negative going direction) a positive pulse is produced at V3 as shown in FIG. 3. The pulse width of V3 is typically 0.5 milliseconds. That is, the time it takes $V_{IN}$ to make a transition from $+V_{T2}$ volts to $-V_{T1}$ volts or from $-V_{T1}$ to $+V_{T2}$ is, typically, 0.5 milliseconds for a 60 Hz 24 volt peak-to-peak AC signal. However the pulse width may vary over a relatively wide range depending on the amplitude of the AC supply. But, the limit of normal expiration for this particular example is in the range of 1.5 to 2 milliseconds. Since the normal pulse width is not an error, it is essential that any positive pulse less than 0.5 milliseconds be filtered out of the system. In fact, the circuits of FIGS. 1 and 2 are designed to filter out any signal whose pulse width is less than 2.68 milliseconds. However, this choice is somewhat arbitrary and could be made either shorter or longer by controlling the duration sensor, as described below.

During abnormal operation (i.e. when $V_{IN}$ is between $+V_{T2}$ volts and $-V_{T1}$ volts for more than 0.5 milliseconds) both V1 and V2 go high and remain high as shown in FIG. 3 for times after $t_{47}$. As detailed below when V3 remains high for longer than a minimum preselected period, the output (Q3) of duration sensor 31 goes "high", indicating a fault or error.

The output V3 of detector 29 is applied to duration sensor 31 which measures the duration of the V3 pulse. As shown in FIG. 2, sensor 31 includes flip-flops FF1, FF2 and FF3. FF1 and FF2 are clocked data flip-flops while FF3 is a set-reset flip-flop. The V3 signal is applied to the data input (D1) of FF1. The Q output of FF1 is applied to the data input (D2) of FF2. A clock signal (SCK) is applied to the clock inputs of FF1 and FF2. The Q1 and Q2 outputs of FF1 and FF2 respectively and a signal $T_P$ are applied to the 3 inputs of an AND gate 310 whose output is applied to the set input (S3) of FF3. The $T_P$ signal, as shown in FIG. 3, consists of short timing pulses produced within control circuitry 27 just before a transition of the SCK clock. The $T_P$ pulses are produced to prevent "glitches" during certain transitions of the SCK clock. The $\overline{Q1}$ and $\overline{Q2}$ outputs of FF1 and FF2, respectively, and a signal $T_P$ are applied to the inputs of AND gate 311 whose output is applied to the rest input (R3) of FF3. The output Q3 of FF3, which also defines the output of the duration sensor, is applied to microprocessor 25.

Q1 and Q2 are AND'ed together with the $T_P$ pulse to provide the set input to FF3. All 3 signals have to be high to produce a high set input. The $T_P$ pulse has been added to ensure that no positive output is produced during the brief interval when Q1-high is going low and Q2-low is going high. The role of the $T_P$ pulse AND'ed with $\overline{Q1}$ and $\overline{Q2}$ serves a similar function.

The structure and operation of a circuit very similar to duration sensor 31 is set forth in detail in copending application of James E. Gillberg bearing Ser. No. 450,062 filed 12/15/82 entitled TRANSIENT SIGNAL SUPPRESSION CIRCUIT and assigned to the assignee of this application, and its teachings are incorporated herein by reference. Therefore, the operation of sensor 31 need not be set forth in great detail.

For ease of explanation, assume that clock signal (SCK) applied to duration sensor 31 is obtained from control circuitry 27 which includes an oscillator and frequency decoding circuitry (not shown in detail), and that each cycle of the SCK clock has a period of two (2) milliseconds as shown in FIG. 3. Assume also that each one of FF1 and FF2 functions such that the signal present at its data input (D) is transferred to its respective Q output on a positive going transition of the SCK clock signal.

During normal operation, the occurrence of a positive going SCK transition when V3 is high (e.g. between times $t_0$, and $t_1$ or $t_9$ to $t_{11}$, causes Q1 of FF1 to go high. Once Q1 is driven high, it remains high or "1" until the next positive going transition of the SCK clock at time $t_4$. However, at time $t_4$, V3 is low, causing Q1 to be set to a low or "zero", condition. Due to the time delay in the response of FF1, Q1, which was high when SCK made a low-to-high transition, causes Q2 to go high at time $t_4$. Q1 and Q2 which are AND'ed with $T_P$ via gates 310 produces a "low" signal which is applied to S3 of FF3. Consequently, Q3 remains low.

Q2 remains positive until the next positive going transition of SCK at time $t_8$. At time $t_8$, V3 and Q1 are both zero. Hence Q2 is set to zero and both Q1 and Q2 are zero. Consequently Q3 remains low. Thus, during normal operation, V3 is not "high" long enough to encompass two positive going transition of the SCK clock and thus to cause both Q1 and Q2 to be "high" at the same time. It is only when V3 remains "high" for a period encompassing at least two consecutive positive transitions of the SCK clock that Q1 and Q2 are both set high. When Q1 and Q2 are both high and a "high" $T_P$ pulse is present, the output of gate 310 goes "high" and, FF3 is set such that Q3 goes high. This is best explained with reference to FIG. 3 beginning with time $t_{47}$ when V3 goes high. At time $t_{48}$, SCK goes high causing Q1 to go high while Q2 is low. At time $t_{52}$, SCK goes high again. Now Q1 and V3 are both high. Hence Q1 continues high and Q2 goes high. The output of gate 310 remains low until time $t_{53+}$ when $T_P$ goes high. At that point the output of 310 goes high and the output of 311 goes low. S3 is set high and R3 is set low causing Q3 to be driven high.

As noted above, timing pulse $T_P$ is AND'ed together with Q1 and Q2 to ensure that no false triggering pulses are produced, i.e. the $T_P$ pulse ensures that the set signal to FF3 will not occur when Q1 is going low (high) and Q2 is going high (low).

Thus, as shown in FIG. 3, $V_{IN}$ must be low for (approximately) at least 2 milliseconds to produce an error signal and may be low for (approximately) as much as 4 milliseconds before an error signal is produced.

In the circuit of FIG. 2, the threshold range was set at $+V_T$ volts about zero volts. It should be appreciated that the threshold range may be extended to a much wider range. This would be useful, for example, when sensing a "Brown-out" (i.e. a decrease in potential) as opposed to a "Black-out" (i.e. total failure).

In the Figures, the reference potential has been shown as zero volts. It should be understood that the AC supply may be caused to vary about a DC level other than zero volts, and the detector circuit modified accordingly.

What is claimed is:

1. In a system adapted to receive an alternating current (AC) supply voltage which normally changes its direction at regular intervals and alternates positively and negatively about a reference voltage, a circuit for detecting a reduction in the amplitude of the AC supply voltage comprising:
    means responsive to the unrectified and unfiltered amplitude of the AC supply voltage for sensing its amplitude relative to said reference voltage and for producing a pulse whose width is proportional to the period of time the amplitude of the AC supply voltage is less negative than a first threshold level below said reference potential and less positive than a second threshold level above said reference potential; and
    means for sensing the duration of said pulse for producing an error signal when the duration of said pulse exceeds a predetermined time period.

2. In a system in which an alternating current (AC) supply voltage is rectified to produce a DC operating voltage for use in the system, a circuit for detecting a reduction in the system, a circuit for detecting a reduction in the AC supply voltage comprising:
    means for sensing the presence of the AC supply voltage including means, directly coupled to the AC voltage, responsive to the unrectified and unfiltered amplitude of the AC voltage being less negative than a first threshold level below a reference potential and less positive than a second threshold level above said reference level for producing a signal having a first value when the AC supply voltage is within a range bounded by said first and second threshold levels and having a second value when the amplitude of said AC voltage exceeds said first and second threshold levels; and
    means for sensing the duration of said first signal and for producing an error signal when the duration of said first signal exceeds a predetermined period.

3. The combination as claimed in claim 2 wherein said means for sensing the amplitude of said AC supply voltage is a band detector.

4. The combination as claimed in claim 2 wherein said means for sensing the amplitude of said AC supply voltage includes first and second insulated-gate field-effect transistors (IGFETs), each IGFET having first and second electrodes defining the ends of a conduction path and a control electrode;
    means connecting one end of the conduction path of said first IGFET and the control electrode of said second IGFET to said AC supply voltage;
    means connecting the control electrode of said first IGFET and one end of the conduction path of said second IGFET to said reference potential;
    means connecting a first load impedance between the other end of the conduction path of said first IGFET and said DC voltage; and
    means connecting a second load impedance between the other end of the conduction path of said second IGFET and said DC voltage.

5. The combination as claimed in claim 4 further including means responsive to the signal produced at the drain electrodes of said first and second IGFETs for producing said signal having said first value when said first or second IGFETs are conducting and for producing a signal having a second value when said first and second IGFETs are non-conducting.

6. In a system adapted to receive an alternating current (AC) supply voltage which goes positive and negative about a reference at regular intervals and including means for rectifying the AC voltage to produce a direct current (DC) operating voltage for use in the system, a circuit for detecting a reduction in said AC supply voltage comprising:
    means, directly coupled to the AC voltage, for sensing the amplitude of the unrectified and unfiltered AC supply voltage relative to said reference for producing a first signal whenever the amplitude of the AC voltage is less than a predetermined level relative to said reference; and
    means for sensing the duration of said first signal and for producing an error signal if the duration of said first signal exceeds a predetermined period.

7. The combination comprising:
    a point of reference potential and a point of operating potential;
    an input terminal adapted to receive a signal which may go positive or negative with respect to said reference potential;
    first and second output terminals;
    first and second insulated-gate field-effect transistors (IGFETs), each IGFET having source and drain electrodes defining the ends of a conduction path, and a control electrode for controlling the conductivity of said conduction path;
    means coupling the source electrode of said first IGFET and the control electrode of said second IGFET to said input terminal;
    means coupling the control electrode of said first IGFET and the source electrode of said second IGFET to said point of reference potential;
    means coupling said drain electrodes of said first and second IGFETS to said first and second output terminals, respectively; and
    first and second load impedance means coupled between said point of operating potential and said first and second output terminals, respectively.

8. The combination as claimed in claim 7 wherein each one of said first and second IGFETS has a substrate region, wherein the substrate of the first IGFET is connected to its source electrode;
    wherein the substrate of said second IGFET is connected to its source electrode; and wherein the substrate of said first IGFET is electrically isolated from the substrate of the said second IGFET.

9. The combination as claimed in claim 7 further including AND'ing means; and
   wherein said first and second outputs are applied to said AND'ing means.

10. The combination as claimed in claim 7 wherein a signal is produced at said first output having a first binary significance when the signal at said input terminal is less negative than the threshold voltage of said first IGFET; and
   wherein the voltage produced at said second output terminal is of said first binary significance when the voltage at said input terminal has an amplitude which is less positive than the threshold voltage of said second IGFET; and
   further including means for AND'ing said first and second outputs for producing an output signal having a given binary significance when said first and second outputs are simultaneously at said first binary level.

* * * * *